(12) United States Patent
Ku et al.

(10) Patent No.: US 8,413,814 B2
(45) Date of Patent: Apr. 9, 2013

(54) FRONT OPENING UNIFIED POD DISPOSED WITH PURGEABLE SUPPORTING MODULE

(75) Inventors: Chen-Wei Ku, Tucheng (TW);
Shao-Wei Lu, Tucheng (TW);
Ming-Long Chiu, Tucheng (TW)

(73) Assignee: Gudeng Precision Industrial Co, Ltd, Taipei County (TW)

( * ) Notice: Subject to any disclaimer, the term of this patent is extended or adjusted under 35 U.S.C. 154(b) by 226 days.

(21) Appl. No.: 12/952,528

(22) Filed: Nov. 23, 2010

(65) Prior Publication Data
US 2011/0062052 A1 Mar. 17, 2011

Related U.S. Application Data

(63) Continuation-in-part of application No. 12/202,389, filed on Sep. 1, 2008, now Pat. No. 8,047,379.

(30) Foreign Application Priority Data

Oct. 12, 2010 (TW) ................................ 99134683 A

(51) Int. Cl.
*B65D 85/30* (2006.01)
*H01L 21/673* (2006.01)
(52) U.S. Cl. ...................................... 206/711; 206/710
(58) Field of Classification Search ............... 206/711, 206/710, 832, 833, 454, 455; 211/41.18
See application file for complete search history.

(56) References Cited

U.S. PATENT DOCUMENTS

| 4,745,088 | A  | * | 5/1988 | Inoue et al. ....................... 117/98 |
| 4,957,781 | A  | * | 9/1990 | Kanegae et al. ........... 427/255.26 |
| 5,879,458 | A  | * | 3/1999 | Roberson et al. .............. 118/715 |
| 6,221,163 | B1 | * | 4/2001 | Roberson et al. .............. 118/715 |
| 6,364,922 | B1 | * | 4/2002 | Tanaka et al. ................ 55/385.1 |
| 6,368,411 | B2 | * | 4/2002 | Roberson et al. .............. 118/715 |
| 6,430,802 | B1 | * | 8/2002 | Miyajima ....................... 29/464 |
| 6,736,268 | B2 |   | 5/2004 | Nyseth |
| 6,758,876 | B2 | * | 7/2004 | Suzuki et al. ................ 55/385.6 |
| 6,899,145 | B2 | * | 5/2005 | Aggarwal ....................... 141/11 |
| 7,658,289 | B2 | * | 2/2010 | Sumi et al. ..................... 206/710 |
| 2006/0283774 | A1 |   | 12/2006 | Hasegawa |
| 2010/0051503 | A1 |   | 3/2010 | Chiu et al. |

FOREIGN PATENT DOCUMENTS

WO WO-2009114798 A2 9/2009

* cited by examiner

*Primary Examiner* — Steven A. Reynolds
(74) *Attorney, Agent, or Firm* — Ming Chow; Sinorica, LLC

(57) ABSTRACT

A Front Opening Unified Pod (FOUP) having a purgeable supporting module disposed at the junction of each sidewall and the backwall of the container, the characteristic of the FOUP being in that: the purgeable supporting module has a buffer gas chamber and a gas inlet is disposed at one end of the buffer gas chamber and connected to a gas valve on the bottom surface, an outgassing channel is disposed on the purgeable supporting module facing the opening of the FOUP, and a long slot is disposed on one side of the outgassing channel, an airflow channel being disposed between and thus connecting the outgassing channel and the buffer gas chamber, and a plurality of supporting ribs being vertically disposed on one side of the long slot at intervals.

16 Claims, 20 Drawing Sheets

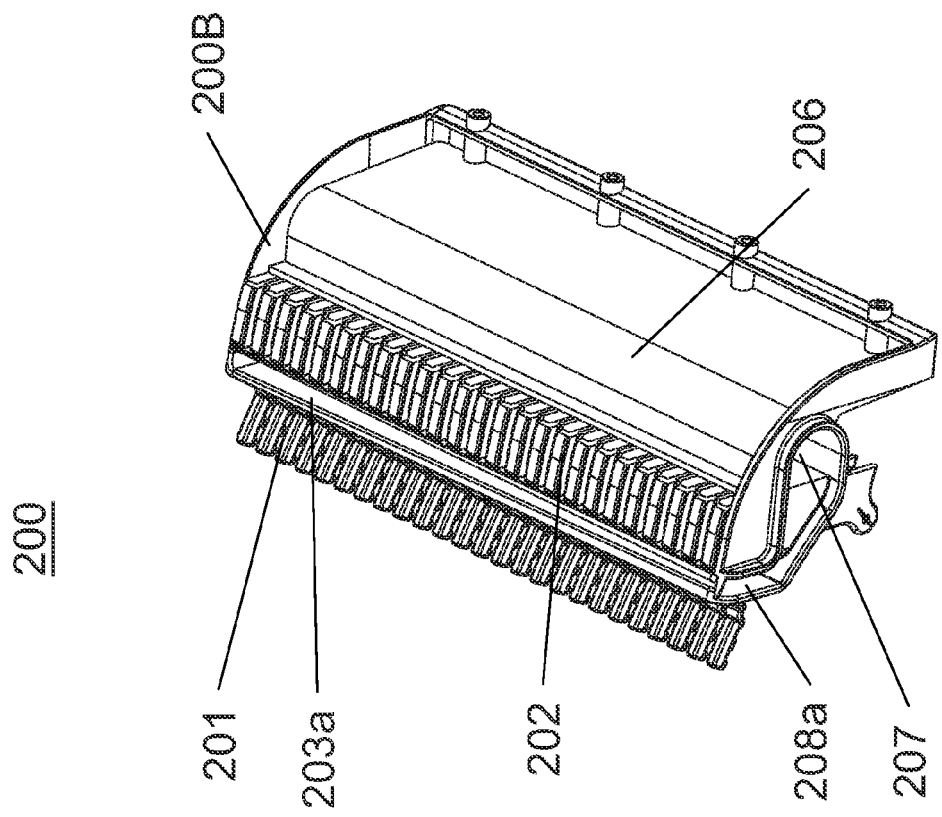

US 8,413,814 B2

FRONT OPENING UNIFIED POD DISPOSED WITH PURGEABLE SUPPORTING MODULE

The current invention is a continuation-in-part of, and claims a priority to U.S. patent application Ser. No. 12/202,389 filed on Sep. 1, 2008 and issued as U.S. Pat. No. 8,047,379 on Nov. 1, 2011, and the U.S. patent application Ser. No. 12/202,389 claimed a foreign priority to a foreign application of Taiwan 097132635 filed on Aug. 27, 2008. The current application also claims a foreign priority to the following foreign application:
1. Taiwan, 099134683, filed on Oct. 12, 2010

BACKGROUND OF THE INVENTION

1. Field of the Invention

The present invention is related to a Front Opening Unified Pod (FOUP), and more particularly, to a FOUP disposed with purgeable supporting module, a buffer gas chamber being disposed in the purgeable supporting module for gas to form a uniform gas flow field in the FOUP.

2. Description of the Prior Art

Semiconductor wafers need to be transferred by the automated system to different workstations to go through various processes in required equipments. In order to facilitate the transferring of wafers and to protect the wafers from external contaminants during the transferring process, a sealed container is provided for the automatic transferring process. Referring to FIG. 1, which is a view of wafer container of the prior art. The wafer container is a Front Opening Unified Pod (FOUP) that has a container body 10 and a door 20. The container body 10 comprises a pair of sidewalls 10L and a top surface 10T and a bottom surface 10B that are joined with the pair of sidewalls 10L, and an opening 12 is formed on one sidewall. A backwall 10B' is formed on the other sidewall that is opposite to the opening 12, wherein a plurality of slots 11 are respectively disposed on the pair of sidewalls 10L for horizontally supporting a plurality of wafers. The door 20 further includes an outer surface 21 and an inner surface 22, wherein the door 20 is joined with the opening 12 of the container body 10 via the inner surface 22 to protect the plurality of wafers within the container body 10. Furthermore, at least one latch hole 23 is disposed on the outer surface 21 of the door 20 for opening or closing the FOUP. In the FOUP described above, the wafers are horizontally placed in the container body 10, and thus, a wafer restraint component is needed in the FOUP to prevent wafers from displacing or moving toward the opening 12 of container body 10 during the wafer transferring process due to vibration.

Referring to FIG. 2, which is a view of the structure of door 20 of a Front Opening Unified Pod disclosed in U.S. Pat. No. 6,736,268. As shown in FIG. 2, the inner side 22 of the door 20 is disposed with a recess 24. The recess 24 extends from the top end 221 of the inner side 22 to the bottom end 222 and is located between two latch mechanisms 230 (in the interior of the door). A wafer restraint module is further disposed in the recess 24, and the wafer restraint module is composed of two wafer restraint components 100 set side by side. Each wafer restraint component 100 includes a plurality of wafer contacts 110, which are used for sustaining corresponding wafers to prevent wafers from displacing or moving toward the opening of the container body during the wafer transferring process due to vibration.

The aforementioned slots 11 on two sidewalls 10L of the container body 10 and the wafer restraint module on the inner surface 22 of the door 20 are respectively used for supporting and restraining the plurality of wafers carried in the interior of the wafer container. However, friction between these supporters and restraint components and wafers occurs easily in the process of transferring the wafers and results in the generation of particles. When particles are generated in the container body 10 of the wafer container, they may remain on the surface of wafers or contaminate the wafers and thus cause decrease in chip yield. Therefore, wear-resistant materials are usually used when designing supporters and restraint components of wafer container to prevent from the generation of too many particles when the supporters and restraint components are in contact with the wafers. As shown in FIG. 3, which is a sectional view of the supporting module disposed on two sidewalls of the wafer container disclosed in US Patent No. 2006/0283774. The supporting module comprises a plurality of supporters 500 vertically arranged at intervals, and the surface of the supporters 500 is coated with a resin layer 501. The resin layer 501 has low-friction property and can prevent from generation of particles due to friction between supporters 500 and the wafers. However, in this design, since the resin layer 501 includes a bevel, wafers are only supported near the edges when being supported by the resin layer 501 of supporters 500. Thus when the scale of wafers is larger, drooping or sinking of wafers occurs more easily, which not only makes it easier for cracks of wafers to occur but also results more easily in chips or damage to wafers when wafers are transferred by the robotic arm.

Furthermore, certain components are disposed in the interior of the wafer container in some designs; for example, an outgassing opening or slit is formed near the contact area of wafers and the aforementioned supporters or restraint module for carrying particles generated due to friction away from wafers. As shown in FIG. 4, which is a view of the purgeable supporting module that can be disposed inside a wafer container as disclosed in the U.S. Pat. No. 6,899,145. The purgeable supporting module comprises a hollow main body 600, which is fastened to the sidewall of the container body of the wafer container and includes a plurality of vertical supporters 601 extending toward the interior of the container body, the plurality of wafers in the container body being supported by the plurality of supporters via the upper surface 602. A horizontal bar-shaped slot is formed on the side surface 603 of the supporters, from which gas in the hollow main body 600 is expelled to prevent the particles generated due to friction from forming on the surface of the wafers. In the aforementioned structure, as the bar-shaped slot is disposed on the side surface 603 of the supporters 601, it is more possible that the supporting force may be insufficient and thus displacement or overlapping of wafers that cause severer damages of wafers may occur more easily. Moreover, when the wafers are carried by the supporters 601 via the upper surface 602, the contact area between the wafers and the supporters 601 is rather large and makes it easier for particles to generate. In addition, the length of the bar-shaped slot is about the same as the length of wafers, and therefore the gas flow may be too weak and larger purging equipment is needed to provide a larger amount of gas to form gas flow field that functions effectively enough. Thus, a purgeable supporting module with a more comprehensive design is needed to be disposed in the wafer container so that particles can be effectively prevented from generating and forming on the surface of the wafers.

SUMMARY OF THE INVENTION

As described above, there are still some problems with purgeable supporting module disposed in the container body of wafer container of the prior art such that the wafer supporting force is insufficient, the contact area between wafers and supporters is too large, and particles are easily generated. One primary objective of the present invention is thus to provide a FOUP disposed with purgeable supporting module, the purgeable supporting module being disposed at the junction of the sidewall and the backwall of the container body and including at least a long slot facing the opening, gas being expelled from the long slot for controlling the conditions of the internal environment of the FOUP such as atmospheric pressure, moisture, and type(s) of gas in the interior.

Another primary objective of the present invention is to provide a FOUP disposed with purgeable supporting module which includes at least a long slot facing the opening, gas being expelled from the long slot to form a gas flow field for carrying away particles on the wafers to prevent particles from being formed on top of the wafers.

Still another primary objective of the present invention is to provide a FOUP disposed with purgeable supporting module which includes a buffer gas chamber, a gas inlet being disposed at one end of the buffer gas chamber and the buffer gas chamber being connected to the long slot of the outgassing channel; when the pressure in the buffer gas chamber is at saturation pressure, a uniform gas flow is expelled from the long slot to form a gas flow field for carrying away particles on the wafers to prevent particles from being formed on top of the wafers.

Yet another primary objective of the present invention is to provide a FOUP disposed with purgeable supporting module, the supporting module being disposed on sidewall of the wafer container and having a plurality of supporters or supporting ribs vertically arranged at intervals, wherein a wear-resistant supporting round head is disposed on the supporters or supporting ribs for the supporters or supporting ribs to contact the wafers via the supporting round head in order to reduce the area in contact with the wafers and prevent from generation of particles due to friction with wafers.

And still another primary objective of the present invention is to provide a FOUP disposed with purgeable supporting module, the purgeable supporting module being disposed at the junction of sidewall and backwall of the container body and having a plurality of supporters or supporting ribs vertically arranged at intervals and a plurality of restraint components vertically arranged at intervals, the plurality of supporters being located near the sidewall of the container body and the plurality of restraint components being located near the backwall of the container body for the purgeable supporting module to be able to, in addition to supporting the wafers, prevent the wafers from moving toward the backwall and thus reduce the particles generated.

And yet another primary objective of the present invention is to provide a FOUP disposed with purgeable supporting module, a protruding piece being disposed at the front end of each of the supporting ribs of the purgeable supporting module for contacting the back of the wafers so that, by utilizing the length of the supporting ribs, wafers of larger scale can be better supported, deformation or sinking of wafers can be avoided, and yield of wafer process can thus be increased.

To achieve the aforementioned objectives, the present invention discloses a FOUP that comprises a container body, which includes a pair of sidewalls and a top surface and a bottom surface respectively joined to the pair of sidewalls, an opening being formed on a sidewall and a backwall being formed on another sidewall opposite to the opening, a supporting module being respectively disposed on the pair of sidewalls for sustaining a plurality of wafers and a purgeable supporting module being respectively disposed at the junctions of the pair of sidewalls and the backwall, and a door, which includes an outer surface and an inner surface and is joined with the opening of the container body via the inner surface to protect the plurality of wafers in the container body, the characteristic of the wafer container being in that: each purgeable supporting module has a buffer gas chamber and a gas inlet connected to a gas valve of the bottom surface is disposed at one end of the buffer gas chamber, an outgassing channel is disposed on the purgeable supporting module facing the opening and a long slot is disposed on one side of the outgassing channel, an airflow channel being further disposed between and thus connecting the outgassing channel and the buffer gas chamber, and a plurality of supporting ribs arranged at intervals are vertically disposed on one side of the long slot. Moreover, the purgeable supporting module can further comprise a plurality of restraint components vertically arranged at intervals to restrain the wafers from moving toward the backwall of the container body.

BRIEF DESCRIPTION OF THE DRAWINGS

FIG. 9A to FIG. 9F are views of an embodiment of the long slot of the purgeable supporting module of a FOUP of the present invention;

DESCRIPTION OF THE PREFERRED EMBODIMENT

In order to disclose the technology employed, objectives held, and effects achieved by the present invention in a clearer and more complete way, preferred embodiments are described in detail in the following with reference to accompanying drawings and signs for further illustration.

Figure 1:
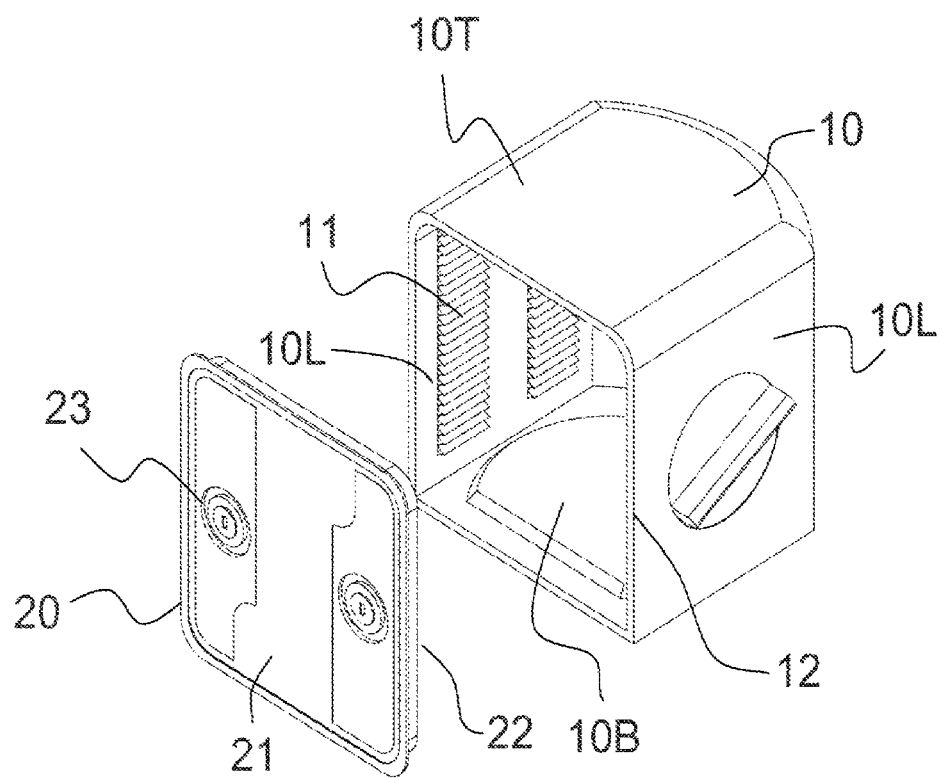
FIG. 1 is a view of the Front Opening Unified Pod (FOUP) of the prior art.
Figure 2:
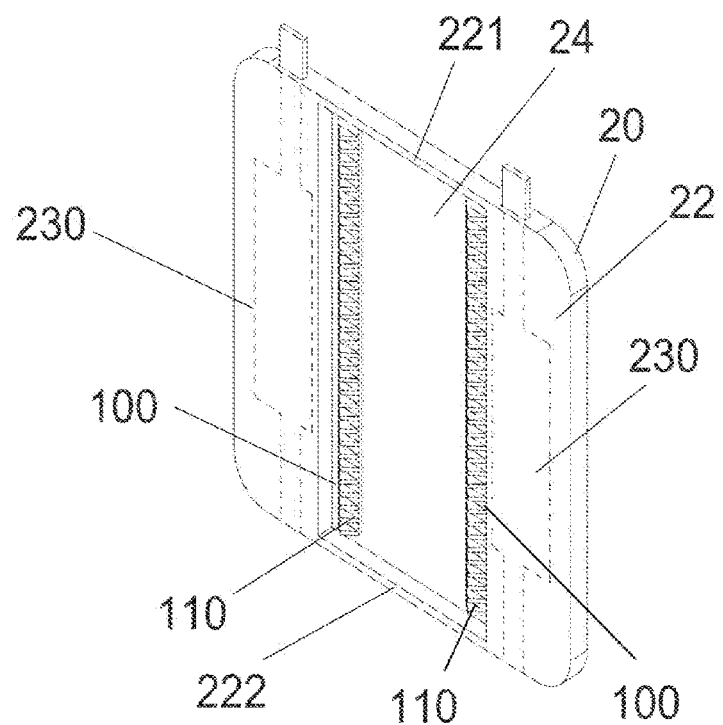
FIG. 2 is a view of the door of the FOUP of the prior art.
Figure 3:
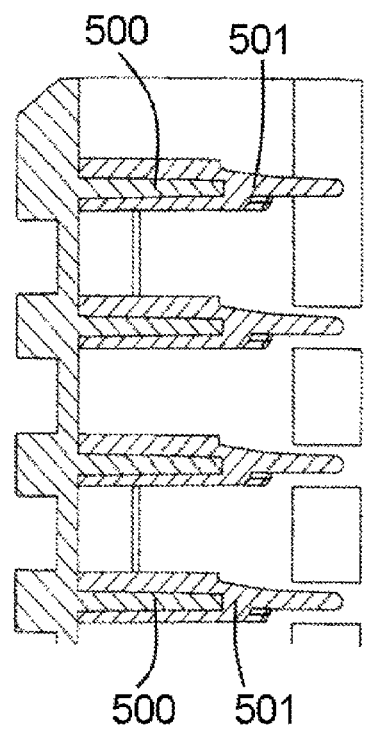
FIG. 3 is a sectional view of the supporting module of the prior art.
Figure 4:
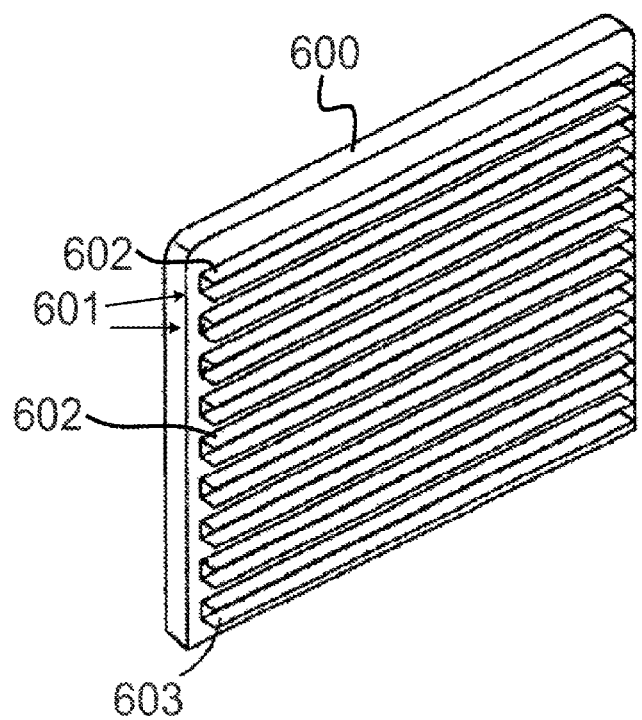
FIG. 4 is a view of the purgeable supporting module of the prior art.
Figure 5:
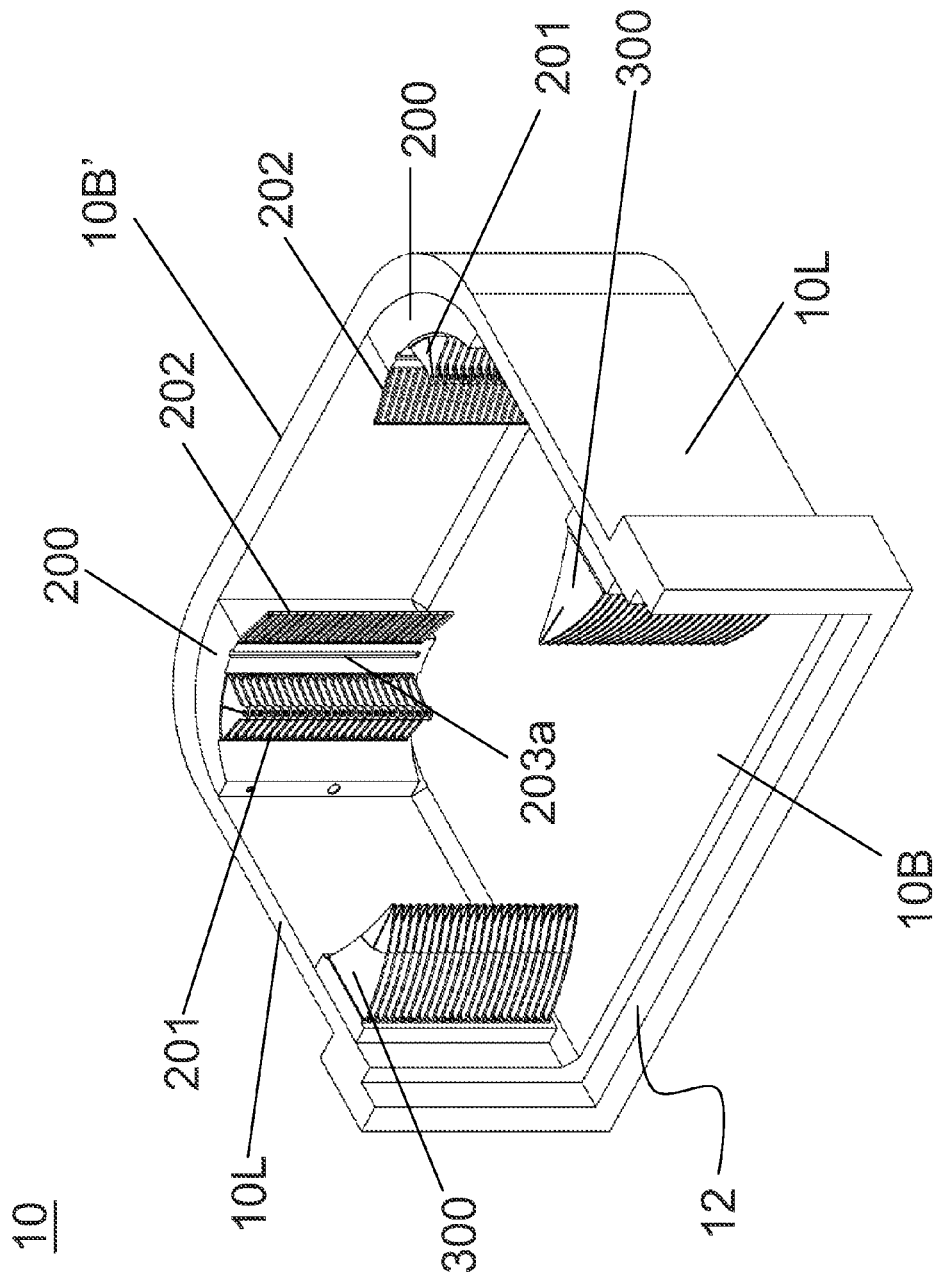
FIG. 5 is a perspective view of the container body of a FOUP of the present invention.
Figure 6:
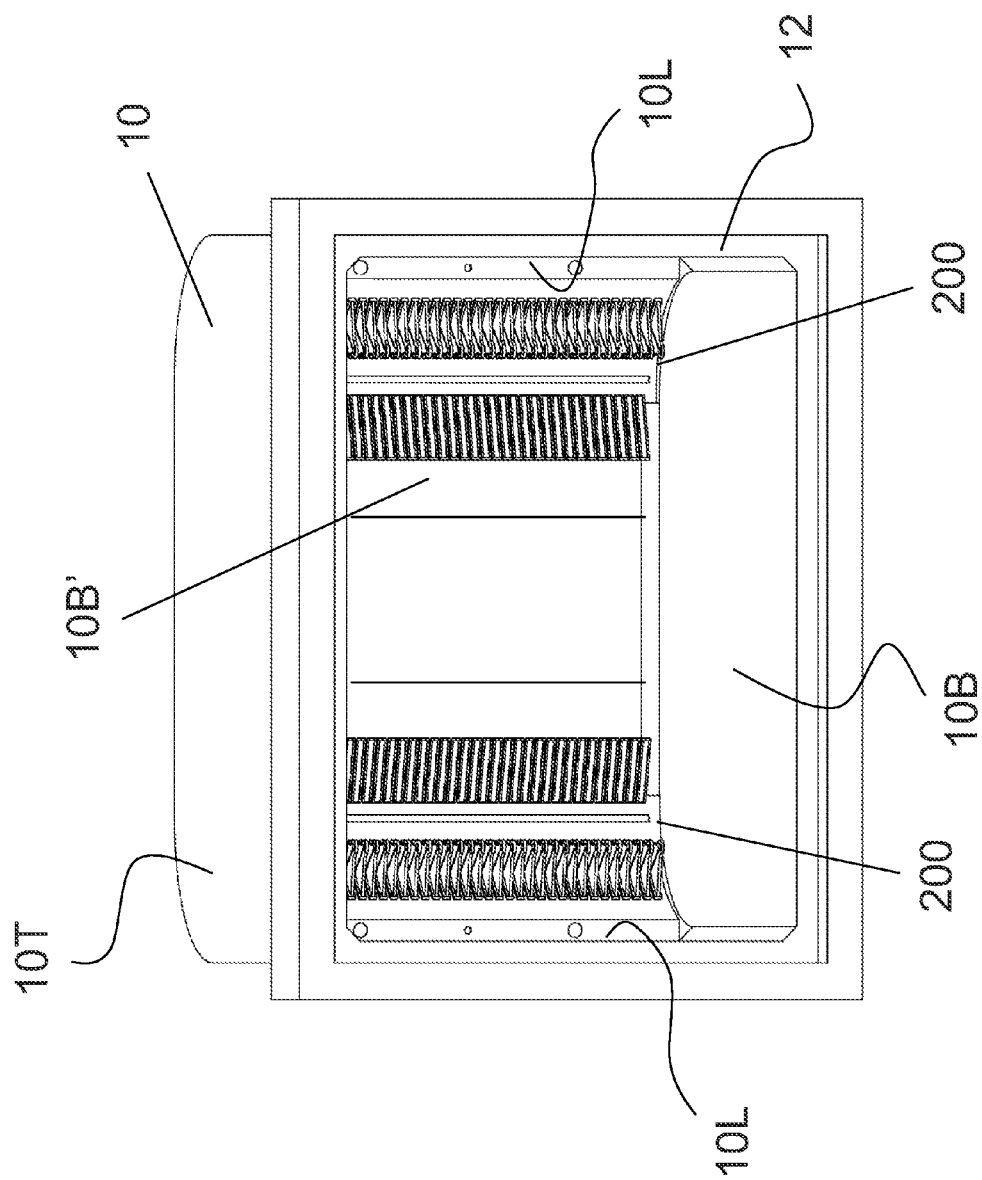
FIG. 6 is a view of the container body of a FOUP of the present invention with only the purgeable supporting module remaining within.
Figure 7:
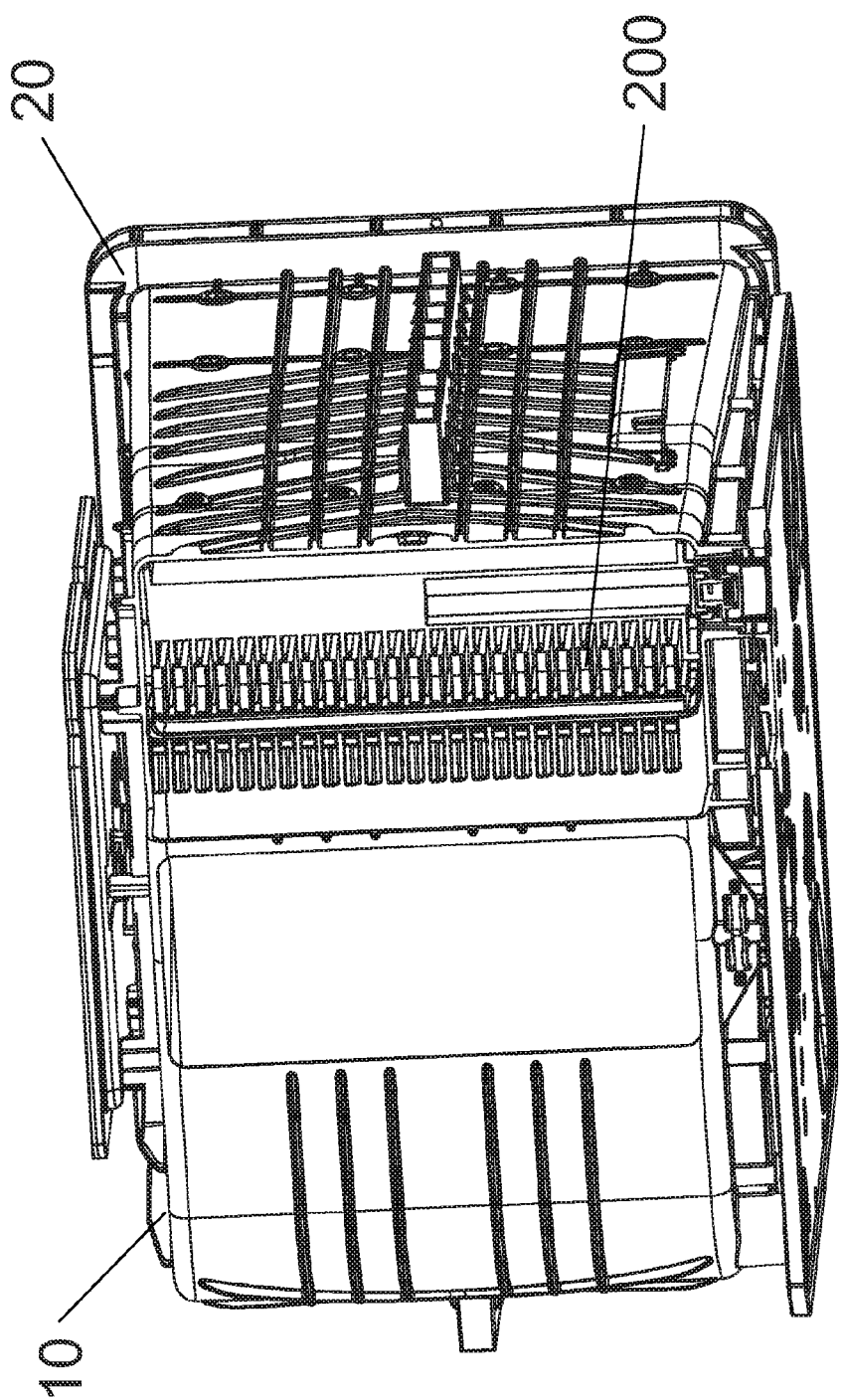
FIG. 7 is a view of the container body of a FOUP of the present invention.

First, referring to FIG. 5, FIG. 6, and FIG. 7, which are respectively a perspective view of the container body of the FOUP of the present invention, a view of the container body with only the purgeable supporting module remaining within, and a side view of the container body with only the purgeable supporting module remaining within. The container body 10 of the FOUP includes a pair of sidewalls 10L and a top surface 10T and a bottom surface 10B joined to the pair of sidewalls 10L, and an opening 12 is formed on one sidewall and a backwall 10B' is formed on another sidewall opposite to the opening 12, wherein a supporting module 300 is respectively disposed on the pair of sidewalls 10L near the opening 12 and a purgeable supporting module 200 is respectively disposed at the junction of the pair of sidewalls 10L and the backwall 10B'. The form of the aforementioned supporting module 300 can be that of the supporting module of the prior art and is not limited in the present invention.

Figure 8A:
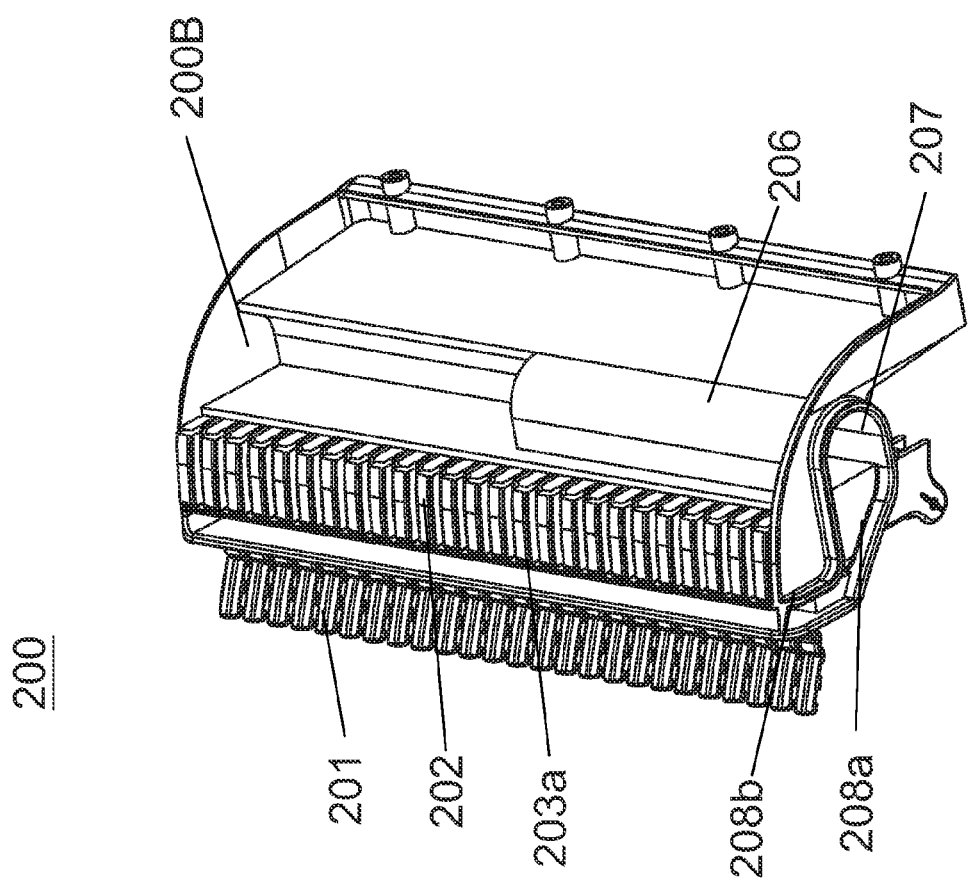
FIG. 8A and FIG. 8B are views of the purgeable supporting module of a FOUP of the present invention.
Figure 8B:
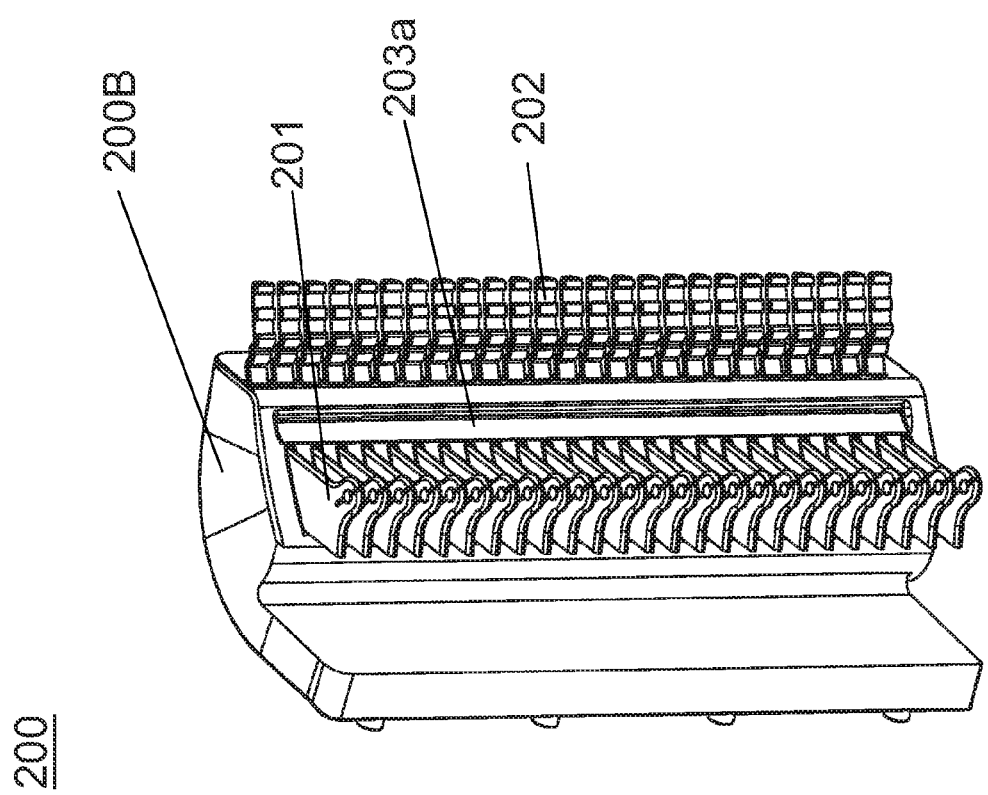

Referring then to FIG. 8A and FIG. 8B, which are views of an embodiment of purgeable supporting module of the present invention. First, as shown in FIG. 8A, the purgeable supporting module 200 of the present invention comprises mainly a main body 200B and two parts extending from the main body 200B for supporting the wafers, wherein the first part comprises a plurality of supporting ribs 201 vertically arranged at intervals and the second part comprises a plurality of restraint components 202 vertically arranged at intervals, an outgassing channel 208b being disposed between the intervals formed by these supporting ribs 201 and restraint components 202 and a long slot 203a being disposed on one side of the outgassing channel 208b; with the design of the outgassing channel 208b and the long slot 203a, the interior of container body 10 can be purged via the long slot 203a; moreover, with the corresponding deployment of the plurality of supporting ribs 201 and the plurality of restraint components 202 and the supporting modules 300 on the pair of sidewalls 10L, the plurality of wafers can be jointly supported. And the purgeable supporting module 200 of the present invention is an integrated structure and can be manufactured by injection molding.

Then, referring to FIG. 8A, FIG. 8B, and FIG. 9A, a buffer gas chamber 206 is disposed in the interior of the aforementioned main body 200B, the height of the buffer gas chamber 206 being the same as that of the main body 200B (as shown in FIG. 9A) or half of the height of the main body 200B (as shown in FIG. 8A). Referring to FIG. 8A and FIG. 9A, a gas inlet 207 is disposed at one end of the buffer gas chamber 206 and can be further connected to one gas valve or gas inlet valve 401 (shown in FIG. 10) on the bottom surface 10B of the container body 10. No matter the height of the buffer gas chamber 206 is the same as that of the main body 200B (as shown in FIG. 9A) or half of the height of the main body 200B (as shown in FIG. 8A), an airflow channel 208a is disposed at the end of the buffer gas chamber 206 with gas inlet 207. When the height of the buffer gas chamber 206 is the same as that of the main body 200B (as shown in FIG. 9A), an airflow channel 208a can be further disposed respectively on two opposite ends of the buffer gas chamber 206; since the airflow channel 208a is disposed between the outgassing channel 208b and the buffer gas chamber 206, the buffer gas chamber 206 and the outgassing channel 208b can be connected to each other via the airflow channel 208a. Therefore, when the gas valve or gas inlet valve 401 of the bottom surface 10B of the container body 10 is connected to a purging apparatus (not shown in Figure), gas can enter the buffer gas chamber 206 via the gas inlet 207. When the pressure of gas in the buffer gas chamber 206 reaches saturation, gas in the buffer gas chamber 206 can only enter the outgassing channel 208b via the airflow channel 208a and be expelled from the long slot 203a on the outgassing channel 208b since the gas inlet 207 is in contact with and shuts off the gas valve or gas inlet valve 401. What is to be particularly emphasized here is that, as the diameter of the long slot 203a, between 0.01 mm and 5 mm, is considerably small when being compared with that of the airflow channel 208a, in the process in which gas is purged and enters the buffer gas chamber 206 via the airflow channel 208a and then enters the outgassing channel 208b, a large portion of the gas first enters the airflow channel 208a connected to the outgassing channel 208b, and, after the airflow channel 208a is again fully purged with gas, then flows into the outgassing channel 208b and is expelled via the long slot 203a. Thus, with the design of the long slot 203a of the present invention, gas expelled from the long slot 203a functions similarly as an air knife. The difference between the pressure gradients of gas expelled on two ends of the long slot 203a will not be too large so that gas expelled from the long slot 203a is kept at certain pressure level for forming a gas flow field between each supporting rib 201 and each restraint component 202 that functions to carry particles scattered around the supporting ribs 201, restraint components 202, and wafers away toward the opening 12 and thus prevent the particles from contaminating the wafers.

Figure 9B:
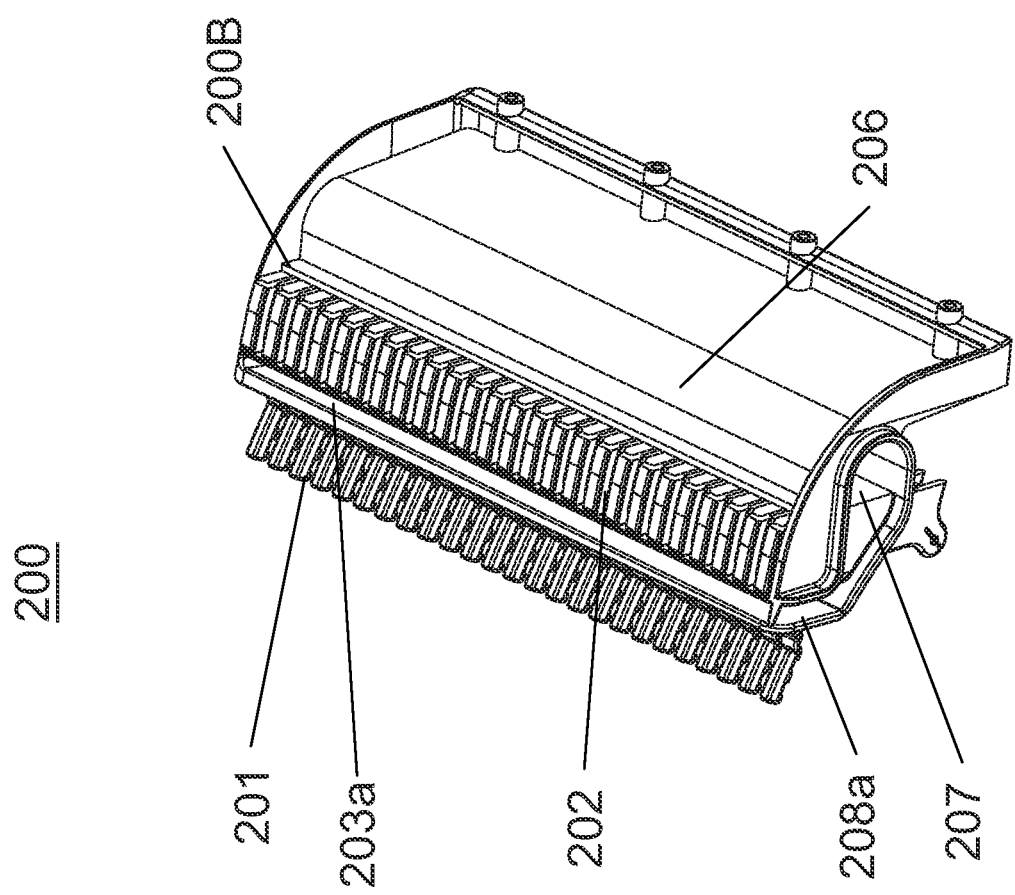
Figure 9C:
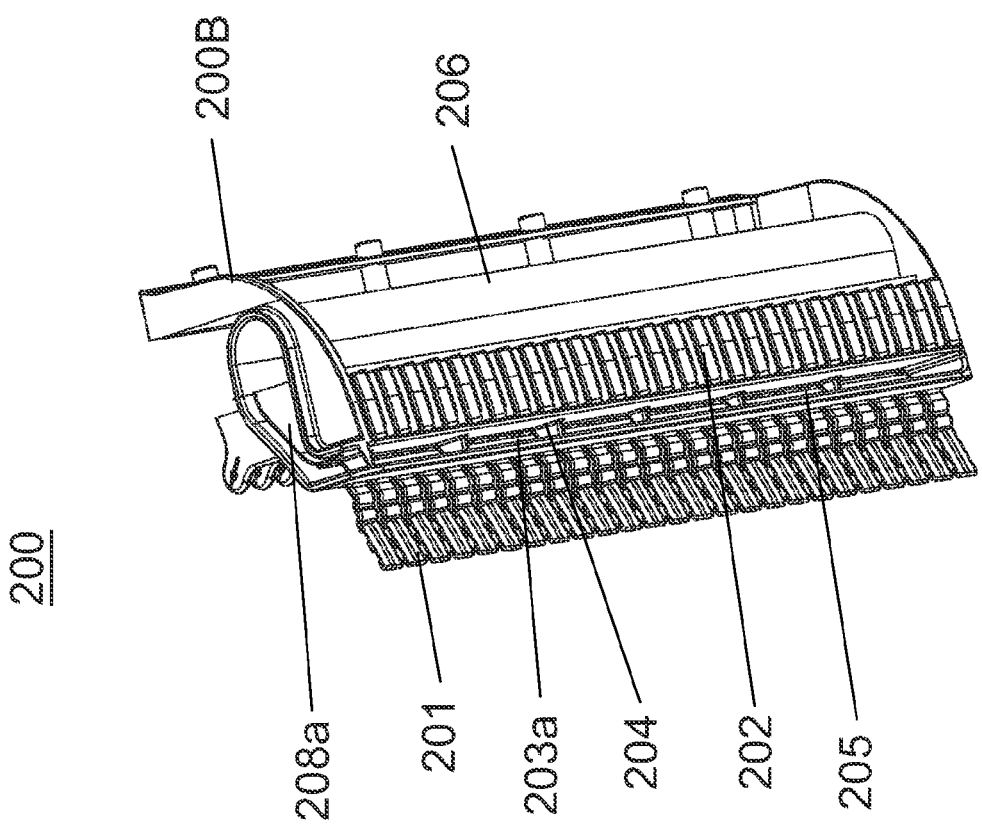
Figure 9D:
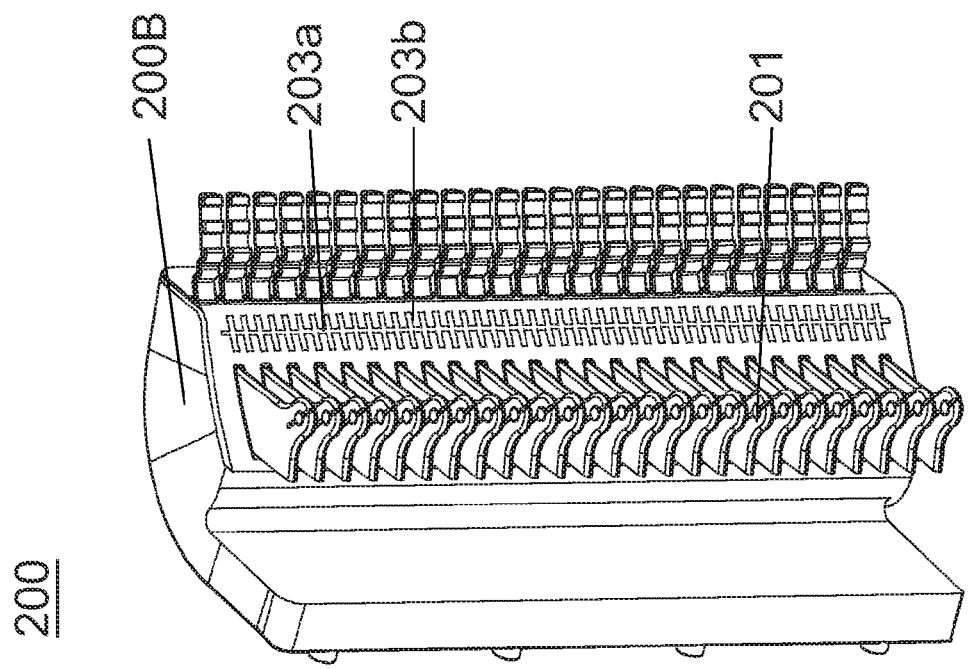
Figure 9E:
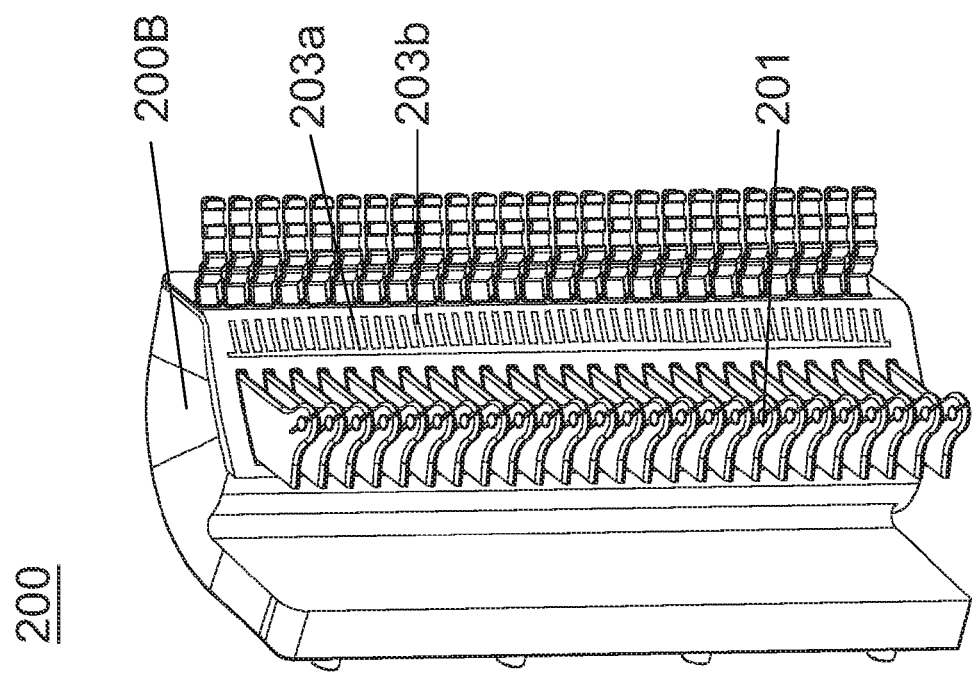
Figure 9F:
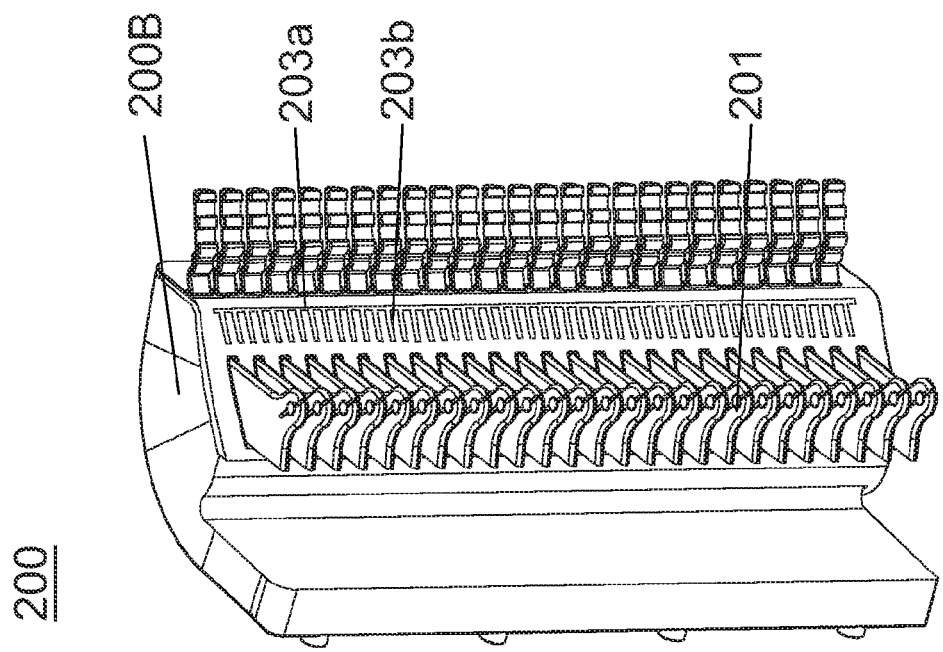
Figure 10:
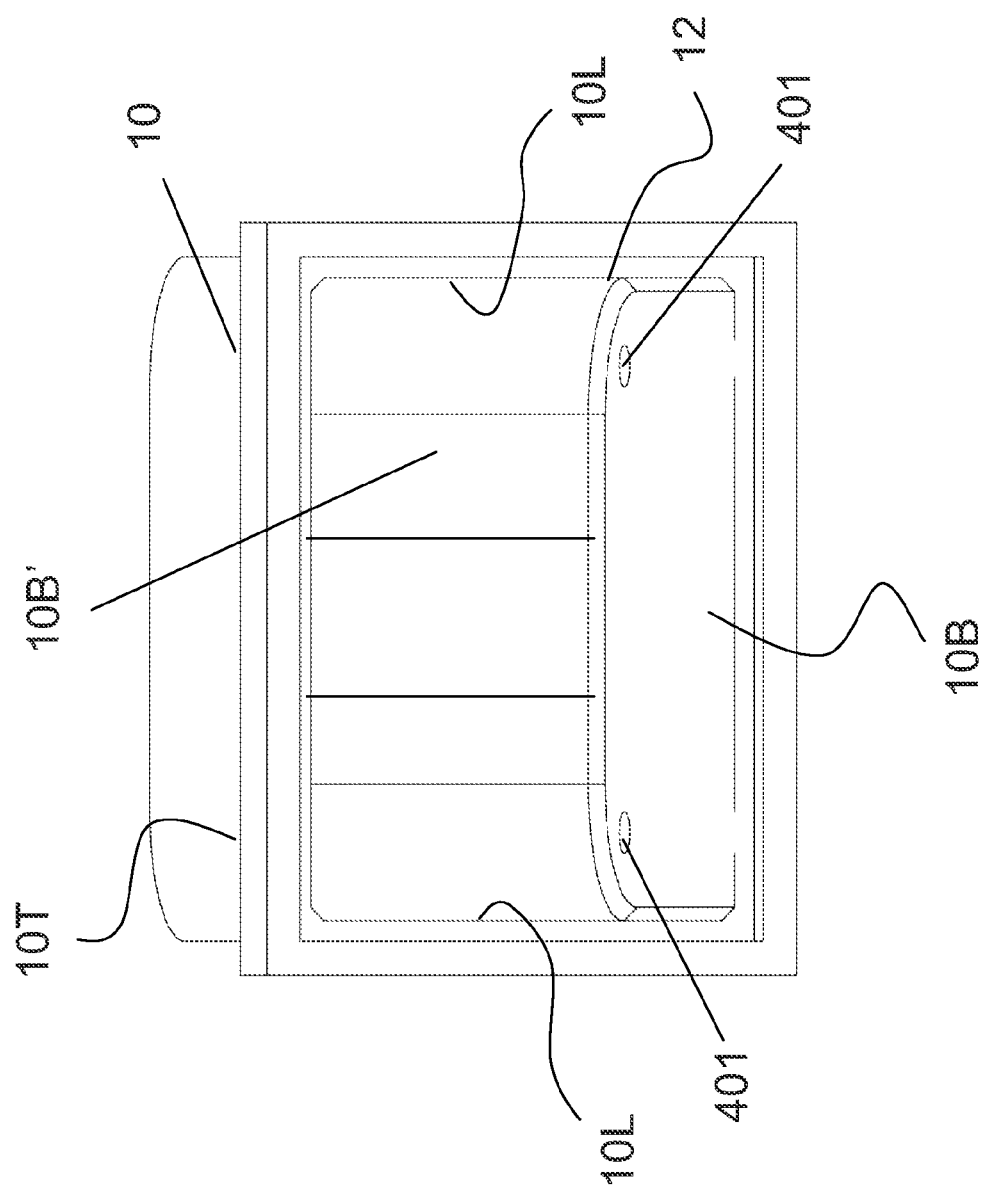
FIG. 10 is a view of a FOUP of the present invention in which the purgeable supporting module is not yet disposed.

In addition, in the embodiment of the present invention, the diameter of the long slot 203a can gradually decrease or increase from bottom to top (i.e. from the first wafer to the twenty-fifth wafer). Referring to FIG. 9A, which is a view of the embodiment of the long slot 203a with its diameter gradually increasing from bottom to top, the diameter of the end of the long slot 203a near the gas inlet 207 is smaller, and as the long slot 203a extends in the direction opposite to the gas inlet 207, the diameter of the long slot 203a gradually increases. Referring then to FIG. 9B, which is a view of the embodiment of the long slot 203a with its diameter gradually decreasing from bottom to top, the diameter of the end of the long slot 203a near the gas inlet 207 is larger, and as the long slot 203a extends in the direction opposite to the gas inlet 207, the diameter of the long slot 203a gradually decreases. However, to be in accordance with the physical phenomenon, as the numerical sequence of wafers runs from the first to the twenty-fifth, the design of the long slot 203a with diameter gradually increasing is preferable to the design of the long slot 203a with diameter gradually decreasing since the former design allows gas expelled to maintain a more uniform pressure. Similarly, the form of the aforementioned long slot 203a can be bar-shaped, as shown in FIG. 8A, or a plurality of partitions 204 can be vertically disposed at intervals in the long slot 203a to form a plurality of gas outlets 205, as shown in FIG. 9C. A plurality of horizontal slots 203b are formed as extending lengthwise from the long slot 203a with a distance in between, the distances in between being not limited in the present invention to be equal among one another, and the horizontal slots 203b can also be formed as extending lengthwise to the right and left sides with the long slot 203a as the center, as shown in FIG. 9D, or as extending lengthwise only to the right or the left side, as respectively shown in FIG. 9E and FIG. 9F. The operating process of purgeable supporting module shown in FIGS. 9A to 9F is the same as that shown in FIGS. 8A and 8B, with the only difference in the design of the long slot 203a, and the description is therefore omitted. Moreover, gas expelled from the long slot 203a can be selected from the following: an inert gas, cold dry air, nitrogen, or combination of gases mentioned above.

In the aforementioned embodiments as shown in FIGS. 8A to 8B and FIGS. 9A to 9F, another gas valve or gas outlet valve (not shown in FIG. 10) can be disposed on the bottom surface 10B of the container body 10 near the opening 12. When the purging apparatus purges the container body 10, a small amount of gas in the container body 10 can be allowed to flow out via the gas valve or gas outlet valve near the opening 12, which not only enables the removal of the particles in the container body 10 but also reduces the time needed to fully purge the container body 10. Naturally, the container body 10 of the present invention can also comprise two pairs of gas inlet valves and gas outlet valves aside from the aforementioned gas valves to fulfill the standard for FOUP.

Figure 11:
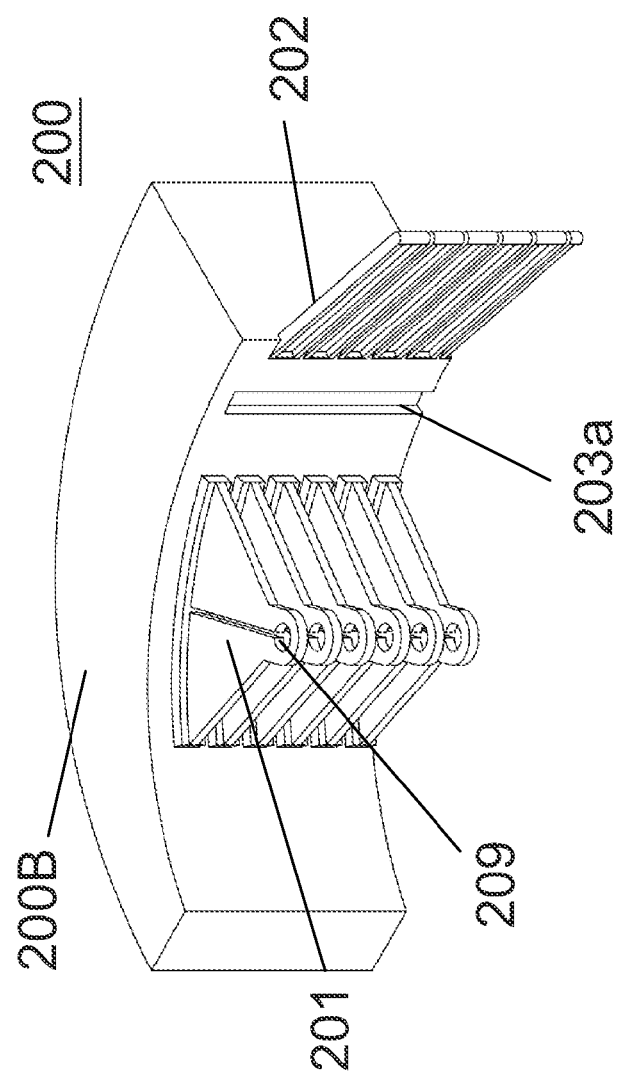
FIG. 11 is a magnified view of the purgeable supporting module of a FOUP of the present invention.
Figure 12:
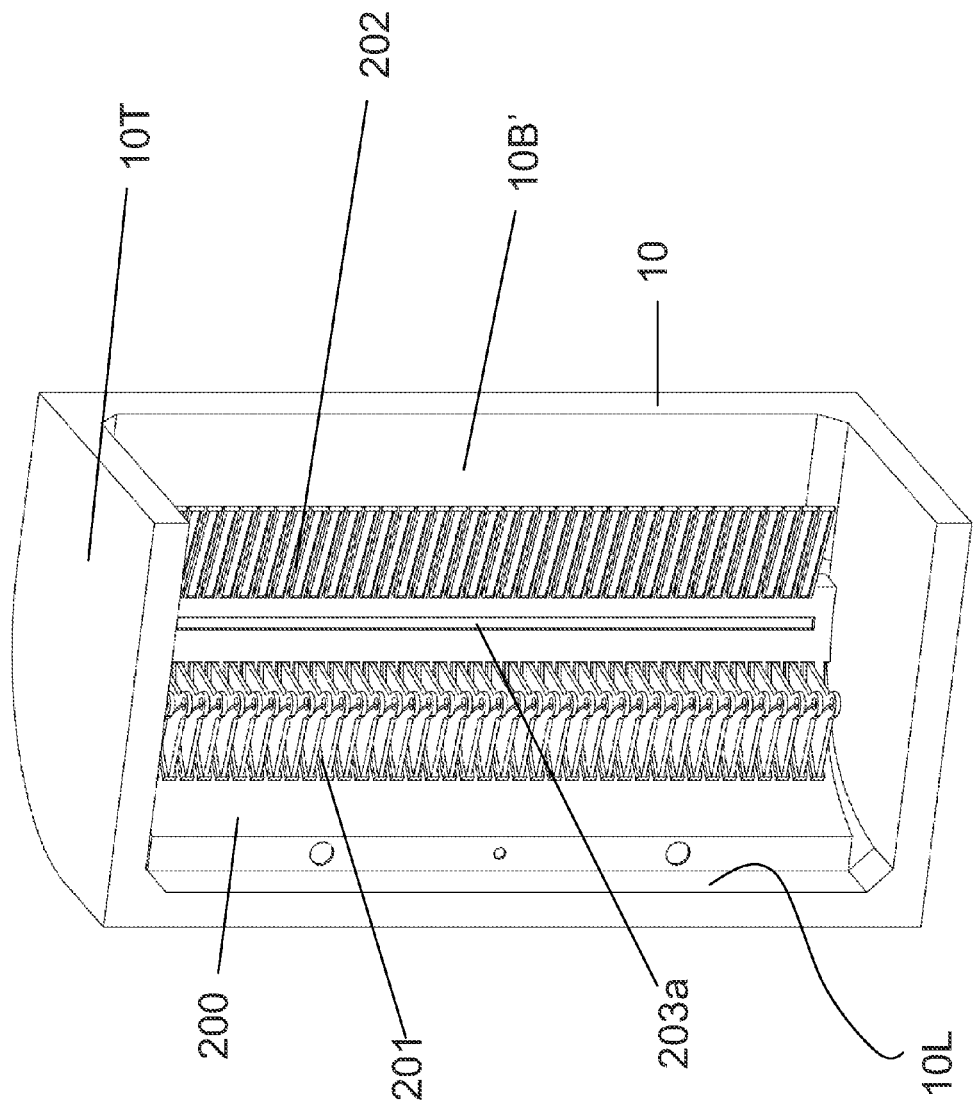
FIG. 12 is a part-sectioned view of a FOUP of the present invention disposed with the purgeable supporting module.

Referring then to FIG. 11, which is a magnified view of purgeable supporting module of the present invention. The purgeable supporting module 200 comprises a plurality of supporting ribs 201, the structure of each of the supporting ribs 201 being like a platform and the material of the supporting ribs 201 being selected from the group consisting of wear-resistant material, thermoplastic material, polymer material, and elastic material; thus, when wafers are supported by the supporting ribs 201 or on the platform structure, friction that causes generation of particles can be avoided. Naturally, as shown in FIG. 11, each of the supporting ribs 201 can further comprise a supporting round head 209 for contacting the wafer and reducing the area in contact with the wafer to further reduce particles generated. Without doubt, it can also be arranged that only the supporting round head of each of the supporting ribs 201 is made of a wear-resistant material while other parts that are not in contact with the wafer are made of other materials to reduce the production cost. The plurality of restraint components 202 of the purgeable supporting module 200 are disposed near or suspended in front of the backwall 10B' (as shown in FIG. 12) and can thus restrain the wafers supported by the supporting ribs 201 or by the supporting round heads 209 of the supporting ribs 201 from moving toward the backwall 10B' to prevent from crashes between wafers and the backwall 10B'. And the restraint components 202 can be slabs made of buffer material or wear-resistant material or shallow recess structures formed by the aforementioned materials for accommodating the wafers. Moreover, the inner surface of the door of the FOUP further comprises at least a restraint module (not shown in Figure), which is used to restrain wafers from moving toward the opening 12.

Figure 13A:
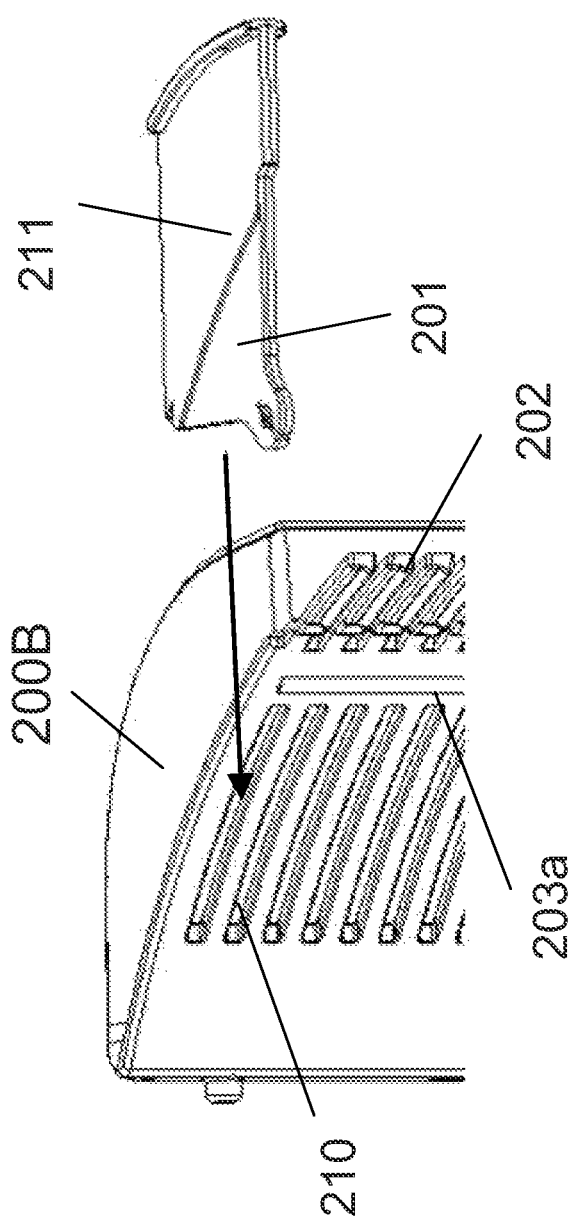
FIG. 13A and FIG. 13B are views of another design of purgeable supporting module of a FOUP of the present invention.
Figure 13B:
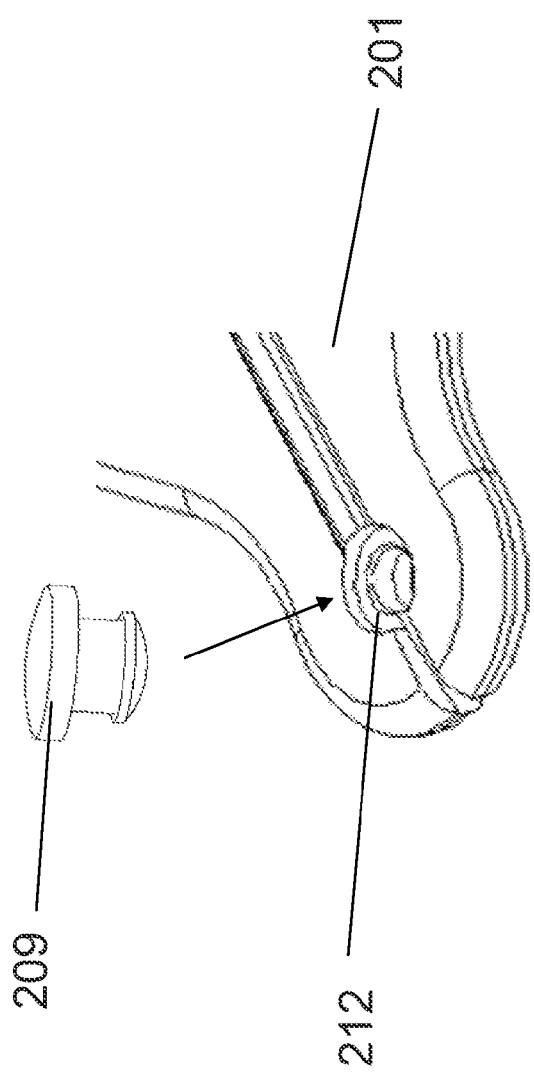

The above-mentioned purgeable supporting module 200 comprises a main body 200B, a plurality of supporting ribs 201 vertically arranged at intervals, a plurality of restraint components 202 vertically arranged at intervals, and a long slot 203a, and the structure of the purgeable supporting module 200 can be integrated to reduce the production cost. Of course, the purgeable supporting module 200 can also be assembled with these components, as shown in FIG. 13A and FIG. 13B. The two sides of the main body 200B of the purgeable supporting module 200 include a plurality of sockets 210 vertically arranged at intervals that allow the insertion of the plurality of supporting ribs 201 for being assembled with and fastened to the main body 200B and forming the arrangement at intervals. As the plurality of supporting ribs 201 are fastened to the main body 200B by being assembled, each of the supporting ribs 201 has a fastening base 211 that can be embedded into the main body 200B of the supporting module 200 and also a round hole 212 that allows a previously separated supporting round head 209 to be fitted in and thus fastened to the supporting rib 201, the supporting ribs 201 thus contacting the wafers via the supporting round heads 209. The material of the supporting round heads 209 can be selected from the group consisting of wear-resistant material, thermoplastic material, polymer material, and elastic material, and other parts of the supporting ribs that are not in contact with the wafers can be made of other materials to reduce the production cost. Furthermore, the purgeable supporting module 200 of the FOUP of the present invention can also comprise only a main body 200B, a plurality of supporting ribs 201 vertically arranged at intervals, and a long slot 203a, the structure of which is still able to support wafers and allow particles around the wafers to be carried away at the same time. Furthermore, a plurality of outgassing holes (not shown in Figure) can also be formed among the plurality of supporting ribs 201 vertically arranged at intervals, and therefore not only the long slot 203a of the purgeable supporting module 200 can be used for expelling the gas, but the plurality of outgassing holes can also be used for carrying away particles around the wafers. Of course, the purgeable supporting module 200 can also comprise a main body 200B, a plurality of supporting ribs 201 vertically arranged at intervals in one row, a plurality of supporting ribs 201 vertically arranged at intervals in another different row, and a long slot 203a, which is not limited in the present invention. Moreover, like the door of the prior art, the door of the FOUP of the present invention can also include a recess disposed on the inner surface of the door and at least a latch structure can also be disposed between the outer surface and the inner surface of the door for the FOUP to operate smoothly.

Although the present invention has been described with reference to the aforementioned preferred embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A front opening unified pod, comprising a container body, having a pair of sidewalls and a top surface and a bottom surface joined with said pair of sidewalls, an opening being formed on one sidewall and a backwall being formed on another sidewall opposite to said opening, a supporting module being respectively disposed on said pair of sidewalls sustaining a plurality of wafers and a purgeable supporting module being respectively disposed at junctions of said pair of sidewalls and said backwall, and a door, having an outer surface and an inner surface, said door being joined with said opening of said container body via said inner surface for protecting said plurality of wafers in said container body, wherein the characteristic of said front opening unified pod is in that:

said each purgeable supporting module has a buffer gas chamber and a gas inlet is disposed at one end of said buffer gas chamber, said gas inlet being connected to one gas valve of said bottom surface, an outgassing channel being disposed on said purgeable supporting module facing said opening and a long slot being disposed on one side of said outgassing channel, and an airflow channel being disposed between said outgassing channel and said buffer gas chamber and thus connecting said outgassing channel and said buffer gas chamber, and a plurality of supporting ribs are vertically disposed at intervals on one side of said long slot.

2. The Front Opening Unified Pod according to claim 1, wherein said long slot is vertically partitioned into a plurality of gas outlets by a plurality of partitions.

3. The front opening unified pod according to claim 1, wherein a plurality of horizontal slots are further formed as extending lengthwise from said long slot, a distance being kept between each of said plurality of horizontal slots.

4. The front opening unified pod according to claim 1, wherein said airflow channel is disposed at the end of said buffer gas chamber having said gas inlet.

5. The front opening unified pod according to claim 1, wherein said airflow channel is disposed at two opposite ends of said buffer gas chamber.

6. The front opening unified pod according to claim 1, wherein outgassing holes are further formed among said plurality of supporting ribs vertically arranged at intervals.

7. The front opening unified pod according to claim 1, wherein a gas is expelled from said long slot, said gas being selected from the group consisting of: inert gases, cold dry air, and nitrogen.

8. The front opening unified pod according to claim 1, wherein structure of said purgeable supporting module is integrated.

9. A front opening unified pod, comprising a container body, having a pair of sidewalls and a top surface and a bottom surface joined with said pair of sidewalls, an opening being formed on one sidewall and a backwall being formed on another sidewall opposite to said opening, a supporting module being respectively disposed on said pair of sidewalls for sustaining a plurality of wafers and a purgeable supporting module being respectively disposed at junctions of said pair of sidewalls and said backwall, and a door, having an outer surface and an inner surface, said door being joined with said opening of said container body via said inner surface for protecting said plurality of wafers in said container body, wherein the characteristic of said front opening unified pod is in that:

said each purgeable supporting module comprises a main body, said main body having a buffer gas chamber and a gas inlet being disposed at one end of said buffer gas chamber, said gas inlet being connected to one gas valve of said bottom surface, and a plurality of supporting ribs vertically arranged at intervals, a plurality of restraint components vertically arranged at intervals, and said plurality of supporting modules on said pair of sidewalls jointly support said plurality of wafers, wherein an outgassing channel is disposed among said plurality of supporting ribs and said plurality of restraint components and a long slot is disposed on one side of said outgassing channel, an airflow channel being disposed between said outgassing channel and said buffer gas chamber and thus connecting said outgassing channel and said buffer gas chamber.

10. The front opening unified pod according to claim 9, wherein said long slot is vertically partitioned into a plurality of gas outlets by a plurality of partitions.

11. The front opening unified pod according to claim 9, wherein a plurality of horizontal slots are further formed as extending lengthwise from said long slot, a distance being kept between each of said plurality of horizontal slots.

12. The front opening unified pod according to claim 9, wherein said airflow channel is disposed at the end of said buffer gas chamber having said gas inlet.

13. The front opening unified pod according to claim 9, wherein said airflow channel is disposed at two opposite ends of said buffer gas chamber.

14. The front opening unified pod according to claim 9, wherein outgassing holes are further formed among said plurality of supporting ribs vertically arranged at intervals.

15. The front opening unified pod according to claim 9, wherein a gas is expelled from said long slot, said gas being selected from the group consisting of: inert gases, cold dry air, and nitrogen.

16. The front opening unified pod according to claim 9, wherein structure of said purgeable supporting module is integrated.

* * * * *